(12) United States Patent
Klass

(10) Patent No.: US 6,911,854 B2
(45) Date of Patent: Jun. 28, 2005

(54) CLOCK SKEW TOLERANT CLOCKING SCHEME

(75) Inventor: Edgardo F. Klass, Palo Alto, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 0 days.

(21) Appl. No.: 10/631,952

(22) Filed: Jul. 30, 2003

(65) Prior Publication Data

US 2005/0024110 A1 Feb. 3, 2005

(51) Int. Cl.$^7$ ................................................. H03K 5/01
(52) U.S. Cl. ......................... 327/165; 327/141; 327/166
(58) Field of Search ..................................... 327/165, 166, 327/170–176, 291–295, 297, 105, 107, 141, 144, 145; 326/93, 96

(56) References Cited

U.S. PATENT DOCUMENTS

| | | | | |
|---|---|---|---|---|
| 5,124,572 A | * | 6/1992 | Mason et al. | 327/145 |
| 5,162,667 A | * | 11/1992 | Yasui et al. | 327/203 |
| 5,487,092 A | * | 1/1996 | Finney et al. | 375/354 |
| 5,742,190 A | * | 4/1998 | Banik et al. | 327/152 |
| 5,864,252 A | * | 1/1999 | Tran et al. | 327/202 |
| 5,903,175 A | * | 5/1999 | Miyashita | 327/218 |
| 5,969,551 A | * | 10/1999 | Fujioka | 327/149 |
| 6,060,924 A | * | 5/2000 | Sugano | 327/202 |
| 6,081,656 A | * | 6/2000 | Witt | 716/3 |
| 6,229,360 B1 | * | 5/2001 | Mizuno et al. | 327/141 |
| 6,331,800 B1 | * | 12/2001 | Radjassamy | 327/566 |
| 6,457,161 B1 | * | 9/2002 | Nadeau-Dostie et al. | 716/6 |
| 6,525,587 B2 | * | 2/2003 | Makino | 327/292 |
| 6,564,360 B2 | * | 5/2003 | Chiu | 716/6 |
| 6,711,724 B2 | * | 3/2004 | Yoshikawa | 716/6 |

* cited by examiner

*Primary Examiner*—Timothy P. Callahan
*Assistant Examiner*—Hai L. Nguyen
(74) *Attorney, Agent, or Firm*—Gunnison, McKay & Hodgson, L.L.P.; Philip J. McKay

(57) ABSTRACT

A clock skew tolerant clocking scheme addresses both the max-time and min-time problems by using dual transparent pulsed latches operated by complementary phases of the clock signal. According to the present invention, the first pulsed latch is triggered by a first pulse derived by the leading edge of a clock signal pulse and the second pulsed latch is triggered by a second pulse derived from the trailing edge of the clock signal. By employing transparent pulse latches, the clock skew tolerant clocking scheme of the invention provides max-time clock skew tolerance. In addition, unlike prior art solutions, according to the invention, the transparency periods of the dual complementary pulsed latches do not overlap so there is never a transparency period between two successive stages and, therefore, there is no opportunity to introduce the min-time, or racing condition, problem.

32 Claims, 6 Drawing Sheets

CLOCK SKEW TOLERANT CLOCKING SCHEME

FIELD OF THE INVENTION

The present invention relates generally to logic circuits and, more particularly, to a skew tolerant clocking scheme for combinational logic circuits.

BACKGROUND OF THE INVENTION

FIG. 1 shows a typical single-phase latch design 100 including: a sending latch 101; a receiving latch 103 and combinational logic 105 coupled between sending latch 101 and receiving latch 103.

As shown in FIG. 1, sending latch 101 includes: clock input 115 for receiving a clock signal CLK; first D terminal 107 and data signal D1; second D terminal 109 and data signal D2; first Q terminal 111 and signal Q1; and second Q terminal 113 and signal Q2. Likewise, receiving latch 103 includes: clock input 125 for receiving clock signal CLK; first D terminal 127 and data signal D1'; second D terminal 129 and data signal D2'; first Q terminal 121 and signal Q1'; and second Q terminal 123 and signal Q2'.

Also shown in FIG. 1 are two paths, max path 131 and min path 141, through combinational logic 105. Those of skill in the art will readily recognize that while in FIG. 1 max path 131 and min path 141 are shown as independent, in practice max path 131 and min path 141 are not necessarily independent paths, i.e., max path 131 and min path 141 can converge, diverge or intersect. However, for simplicity of illustration they are shown in FIG. 1, and assumed in the following discussion, to be independent paths.

When latches are used as synchronization elements, for instance when latches are used to separate pipeline stages, there are two important timing constraints that must be taken into account. The first is the potential presence of slow-propagating signals, such as signals through max-path 131 in FIG. 1, which determines the maximum speed at which the system can be clocked. The second is the potential presence of fast propagating signals, such as signals through min-path 141 in FIG. 1 and determines race conditions.

The max-timing problem can be expressed as:

1. Given the maximum propagation delay, i.e., max-path 131, within a pipeline stage, what is the maximum clock frequency the circuit can accommodate? or
2. Given a fixed clock frequency, what is the maximum allowed propagation delay within a stage?

The min-timing problem, also known as "race through" or a "race condition" occurs where the clock signal races ahead of the data stream. The min-time problem typically arises when an early arriving clock sends data through a short, or minimal, logic path, such as min-path 141 in FIG. 1, and this causes the next stage to update before the destination clock samples the previous data. The same result occurs if the destination clock is late. The result is data racing through two or more stages in a single clock cycle. This is a functional, and typically non-recoverable, problem. The min-time problem is particularly problematic because the min-time problem is not related to the clock cycle, i.e., is frequency independent and therefore, in the prior art, could not be fixed by adjusting the clock frequency, as could be done to solve the max-time problem.

FIG. 2 shows the typical single-phase latch design 100 of FIG. 1 and three clock signals: normal clock signal CLK 201 and skewed clock signals CLKe 203 and CLKl 205. As shown in FIG. 2 clock, signal CLKe is early or "skewed" early with respect to clock signal CLK by skew time Tskew 221 and clock signal CLKl is late or "skewed" late with respect to clock signal CLK by skew time Tskew 231.

Clock skew has become an ever-increasing problem as clock frequencies have continued to increase in microprocessor design since the higher the frequency of the clock, the larger percentage of the clock cycle is consumed by a given clock skew. Consequently, clock skew plays an important role with respect to the max-time and min-time problems discussed above.

FIG. 3 shows a signal diagram 300 for a typical synchronous design when operating as designed and when operating under conditions of early clock skew. Shown is the data signal 311 to be sampled including data packets 313, 315 and 317. It is important to note that data stream 311 changes value at points 308, 310, and 312 such that the data value in data packet 313 can be, and often is, different form the data value in data packet 315 or 317, i.e., the data value changes state from data packet 313 to data packet 315 and to data packet 317.

Also shown in FIG. 3 is clock signal CLK 201. As is typical in the present state of the art, signal diagram 300 is for an "edge triggered" system wherein data stream 311 is sampled at the leading edges 324, 326, and 328 of the clock pulses 323, 325 and 327, respectively. Consequently, at time T1 301, leading edge 324 of pulse 323 of clock signal CLK 201 causes data to be sampled at point 314 of data packet 313 of data stream 311. Likewise, at time T2 303, leading edge 326 of pulse 325 of clock signal CLK 201 causes data to be sampled at point 316 of data packet 315 of data stream 311. Likewise, at time T3 305, leading edge 328 of pulse 327 of clock signal CLK 201 causes data to be sampled at point 318 of data packet 315 of data stream 311.

As shown in FIG. 3, when the CLK signal is normal, i.e., clock signal 201, the operation the design is correct and in accordance with design goals since leading edge 324 of pulse 323 samples or reads data packet 313, leading edge 326 of pulse 325 samples or reads data packet 315, and leading edge 328 of pulse 327 samples or reads data packet 317. As long as this is case, and data stream 311 remains synchronous with clock signal CLK 201, the system functions correctly, and the correct data is sampled at the correct time.

However, also shown in FIG. 3 is early skewed clock signal CLKe 203. In this instance the combination of the max-time problem and the early clock skew 350 reduces the maximum clocking frequency in a prior art design. As shown in FIG. 3 skewed clock signal CLKe 203 differs from clock signal CLK 201 in that a leading or "trigger" edge 354 of clock pulse 353 is displaced or "skewed" early, or to the left, with respect to leading edge 324 of clock pulse 323 by skew time 350. Likewise, a leading "trigger" edge 326 of clock pulse 355 is displaced or "skewed" to the left with respect to leading edge 326 of clock pulse 325 by skew time 350. Likewise, a leading "trigger" edge 358 of clock pulse 357 is displaced or "skewed" to the left with respect to leading edge 328 of clock pulse 327 by skew time 350.

The max-time problem arises from the fact that because of skew time 350, leading edge 354 of clock pulse 353 of skewed clock signal CLKe 203 causes data stream 311 to be sampled at time T4 307, and point 364 of data packet 302 instead of time T1 301, and point 314 of data packet 313. Consequently, data packet 302 is sampled incorrectly instead of the correct data packet 313. Therefore, since the value of data packet 302 can be, and often is, different from the value of data packet 313, incorrect data is sampled and used.

Likewise, because of skew time 350, leading edge 356 of clock pulse 355 of skewed clock signal CLKe 203 causes data stream 311 to be sampled at time T5 308, and point 366 of data packet 313 instead of time T2 303, and point 316 of data packet 315. Consequently, data packet 313 is sampled incorrectly instead of the correct data packet 315. Therefore, since the value of data packet 313 can be, and often is, different from the value of data packet 315, incorrect data is sampled and used.

Finally, because of skew time 350, leading edge 358 of clock pulse 357 of skewed clock signal CLKe 203 causes data stream 311 to be sampled at time T6 309, and point 368 of data packet 315 instead of time T3 305, and point 318 of data packet 317. Consequently, data packet 315 is sampled incorrectly instead of the correct data packet 317. Therefore, since the value of data packet 315 can be, and often is, different from the value of data packet 317, incorrect data is sampled and used.

Those of skill in the art will recognize that a similar problem exists for late clock skew such as the clock skew represented by clock signal 205 in FIG. 2. However, in the case represented in FIG. 3, the late clock skew would have to be quite large to affect the data. However, those of skill in the art will recognize that the max-time problem discussed above is not strictly limited to early clock skew, that early clock skew was shown and discussed for illustrative purposes only, and late clock skew could also have been shown for illustrative purposes with similar effect.

In the prior art, one solution for the max-time problem and clock skew problem was to simply slow down the clock signal 203 frequency to the point that uncertainty in the clock arrival did not result in circuit failure. Obviously, slowing down the clock signal frequency had adverse effects on performance and was very undesirable.

Another prior art solution to the max-time problem in latch-based designs was to employ "transparent" latches between stages. In this prior art solution, dual latches were typically employed that were operated "or latched" by complementary clock phases as opposed to a clock leading edge. Consequently, the arrival of the clock was less critical and, when properly employed, a latch-based design could be made fairly insensitive to the max-time problem. However, as discussed below, this prior art solution to the max-time time problem failed to address the other major problem, the min-time problem, and actually made the min-time problem even worse.

One other prior art solution to the max-time problem was the use of pulse latches with a very short transparency period determined by the clock pulse. Unlike flip-flop designs, pulse latch designs required only one latch and were relatively clock skew tolerant for the max-time problem. However, pulse latches are extremely prone to the min-time problem discussed below because, in addition to the clock skew, the transparency period of the pulse latch also needed to be accounted for and designed to when determining potential races.

The max-time problem is well know to those of skill in the art. Consequently, to avoid detracting from the present invention, a more detailed discussion of the max-time problem, and the effects of clock skew on the max-time problem is omitted here. For a more detailed discussion of the max-time problem the reader is referred to virtually any computer engineering text book. For example, "THE COMPUTER ENGINEERING HANDBOOK", edited by Vojin G. Oklobdzija, CRC press 2002, ISBN 0-8493-0885-1, see chapter 10.2 "LATCHES AND FLIP-FLOPS", authored by the present inventor, pages 10-35 to 10-52.

As discussed above, the other major clock skew problem, the min-time or "race-through" problem, occurs where the clock signal races ahead of the data stream in a flip-flop based design. The min-time typically arises when an early arriving clock sends data through a short, or minimal, logic path, such as min-path 141 in FIG. 1, and this causes the next stage to update before the destination clock samples the previous data. The same result occurs if the destination clock is late. The result is data racing through two or more stages in a single clock cycle. As also discussed above, the min-time problem is particularly problematic because the min-time problem is not related to the clock cycle, i.e., is frequency independent, and therefore, in the prior art, could not be fixed by adjusting the clock frequency.

The min-time problem is well know to those of skill in the art. Consequently, to avoid detracting from the present invention, a more detailed discussion of the min-time problem, and the effects of clock skew on the min-time problem is omitted here. For a more detailed discussion of the min-time problem the reader is referred to virtually any computer engineering text book. For example, "THE COMPUTER ENGINEERING HANDBOOK", edited by Vojin G. Oklobdzija, CRC press 2002, ISBN 0-8493-0885-1, see chapter 10.2 "LATCHES AND FLIP-FLOPS", authored by the present inventor, pages 10-35 to 10-52.

One prior art solution to the min-time problem was to introduce buffer stages in the data stream to slow the data stream to the point that the clock could not race through. Of course, this is a less than ideal solution since it requires additional components and the system must be designed to a worst-case scenario.

In addition, as noted above, in the prior art, one solution for the max-time problem was to simply slow down the clock signal frequency to the point that uncertainty in the clock arrival did not result in circuit failure. However, in the prior art, the min-time problem was frequency independent and therefore could not be solved by such a simple, if inefficient, solution.

In addition, as also noted above, another prior art solution to the max-time problem in latch-based designs was to employ "transparent" latches between stages. In this prior art solution, dual latches were typically employed that were triggered by opposite clock phases. However, the addition of two latches per stage simply aggravated the min-time problem by adding additional opportunities for introduction of race through since race through could happen twice as often, i.e., once per each clock phase.

As also discussed above, one other prior art solution to the max-time problem was the use of pulse latches with a very short transparency period determined by the clock pulse. However, pulse latches are extremely prone to the min-time problem because, in addition to the clock skew, the transparency period of the pulse latch also needed to be accounted for and designed to when determining potential races.

What is needed is a clocking scheme that is clock skew tolerant for both max-time and min-time problems.

SUMMARY OF THE INVENTION

According to the present invention, a clock skew tolerant clocking scheme addresses both the max-time and min-time problems by using dual transparent pulsed latches operated by complementary phases of the clock signal.

According to the present invention, the first pulsed latch is triggered by a first pulse derived by the leading edge of a clock signal pulse and the second pulsed latch is triggered by a second pulse derived from the trailing edge of the clock signal. According to the present invention, the duration or pulse width of the first pulse and the second pulse is determined by the designer with longer, or larger, pulse widths being more tolerant of the max-time problem and the shorter, or smaller, pulse widths being more tolerant of the min-time problem.

In one embodiment of the invention, the pulse width of the first and second pulses is designed to be ten to twenty-five percent of a clock cycle.

By employing transparent pulse latches, the clock skew tolerant clocking scheme of the invention provides max-time clock and using the present invention, the wider the transparent period is made, i.e., the larger the pulse width of the first and second pulses, the more clock skew max-time problem can be hidden. In addition, the wider the transparency period is made, the more well known time borrowing techniques can be employed. However, unlike the prior art latch based solutions to the max-time problem discussed above, the clock skew tolerant clocking scheme of the invention is also tolerant to min-time clocking skew problems as well. This is because, unlike prior art solutions, according to the invention, the transparency periods of the dual and complementary pulsed latches do not overlap and since the transparency periods of the dual and complementary pulsed latches are non-over-lapping, there is typically never a transparency period joining two successive pipeline stages and, therefore, there is no opportunity to introduce racing conditions.

In one embodiment of the invention, the pulse width of the first and second pulses is twenty percent of the clock cycle. Consequently, to a first order, the clock skew tolerant clocking scheme of the invention can tolerate thirty percent (fifty percent of a clock cycle minus the twenty percent pulse width) of clock cycle skew without a min-time failure.

In addition, since, according to the invention, the first pulsed latch is triggered by a first pulse derived by the leading edge of a clock signal pulse and the second pulsed latch is triggered by a second pulse derived from the trailing edge of the clock signal, the min-time clock skew tolerance can be increased by changing the clock frequency since min-time skew tolerance, using the clock skew tolerant clocking scheme of the invention, is determined by the clock cycle time divided by twice the pulse width of either the first and second pulses. Consequently, unlike prior art schemes where the min-time problem was frequency independent, using the clock skew tolerant clocking scheme of the invention, both the max-time and the min-time problems can be solved by adjusting the clock frequency. This feature of the clock skew tolerant clocking scheme of the invention is particularly advantageous during the system debugging phase of the design process since padding and margining for min-time is not required using clock skew tolerant clocking scheme of the invention.

In addition, in one embodiment of the invention, the first and second pulses are generated locally by pulse generators and therefore, in one embodiment of the invention, the system remains a single-phase system and there is no need to distribute additional signals widely.

It is to be understood that both the foregoing general description and following detailed description are intended only to exemplify and explain the invention as claimed.

BRIEF DESCRIPTION OF THE DRAWINGS

The accompanying drawings, which are incorporated in, and constitute a part of this specification, illustrate embodiments of the invention and, together with the description, serve to explain the advantages and principles of the invention. In the drawings.

DETAILED DESCRIPTION

The invention will now be described in reference to the accompanying drawings. The same reference numbers may be used throughout the drawings and the following description to refer to the same or like parts.

Figure 1:
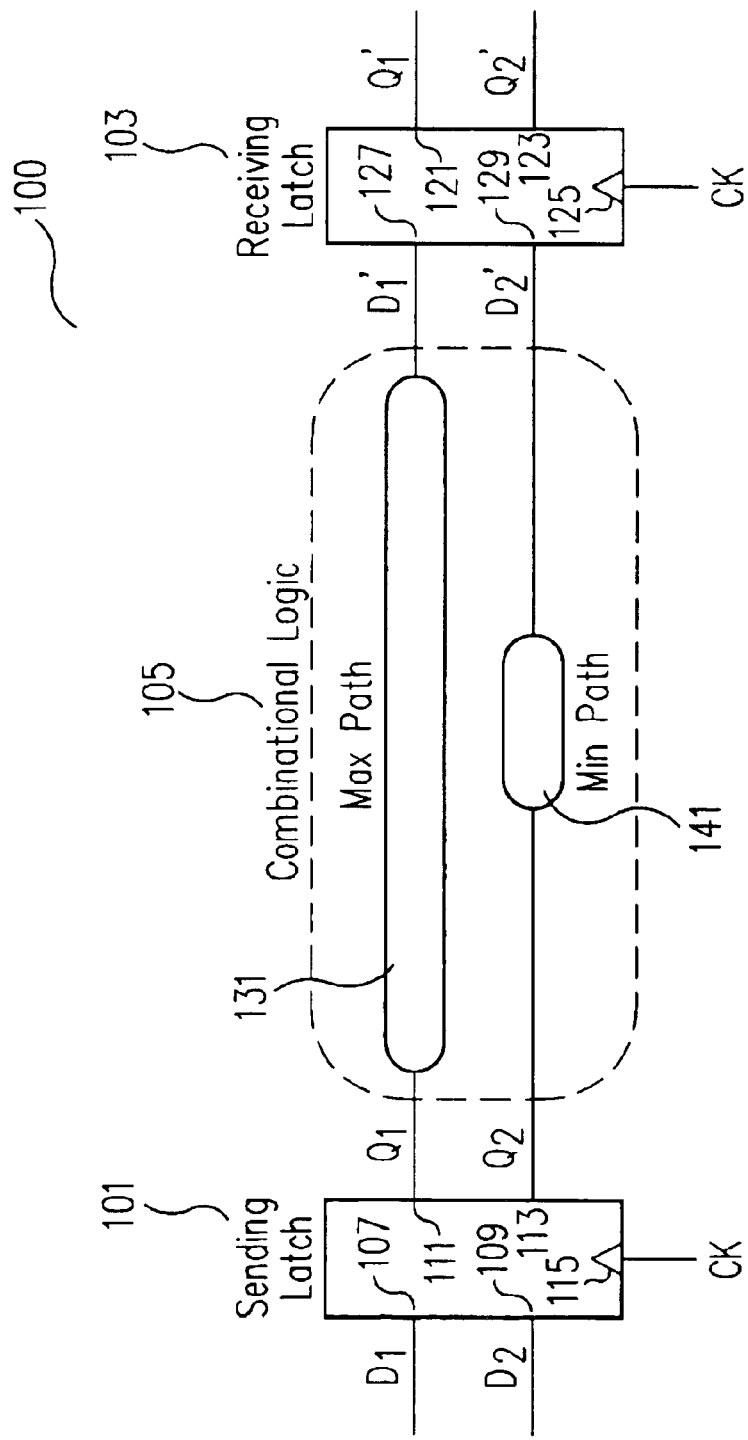
FIG. 1 shows a typical single-phase latch design.
Figure 2:
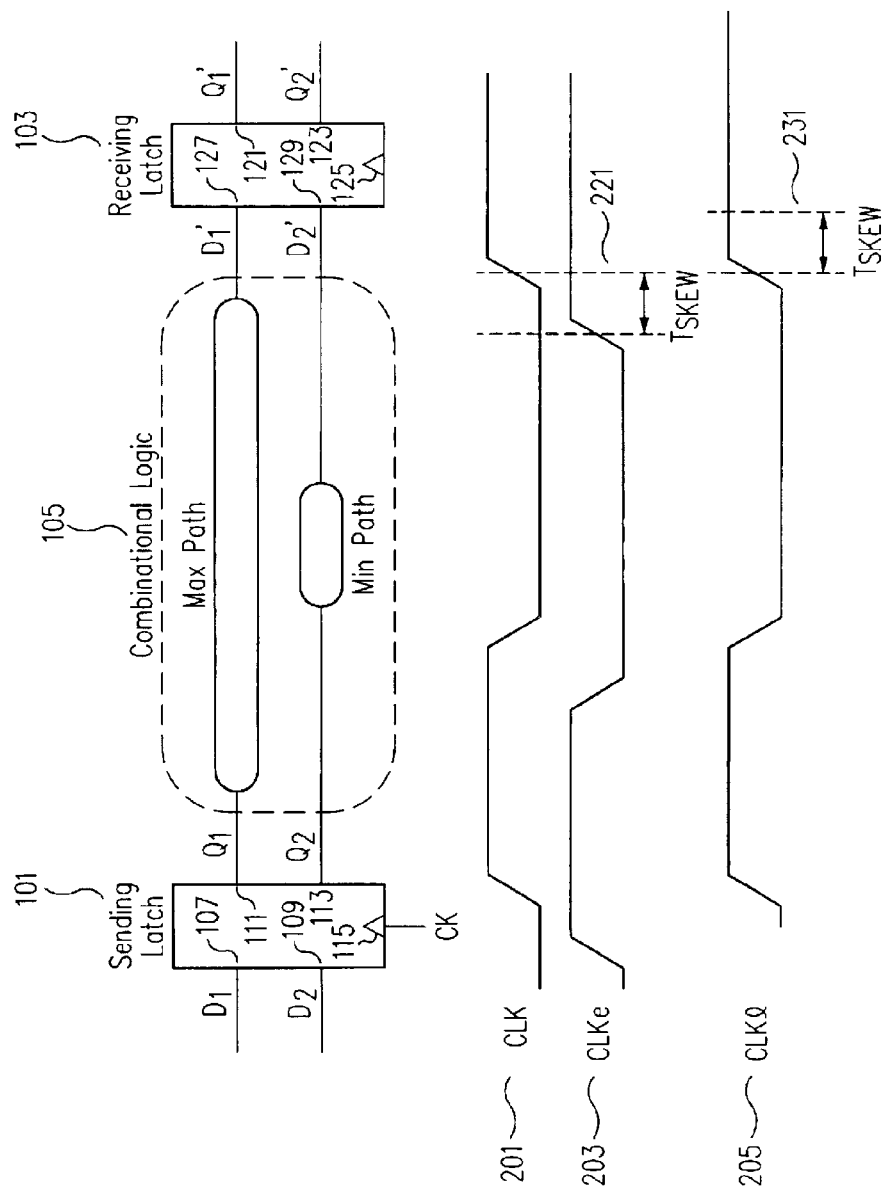
FIG. 2 shows the typical single-phase latch design of FIG. 1 and three clock signals, a normal clock signal CLK and skewed clock signals CLKe and CLKl.
Figure 4:
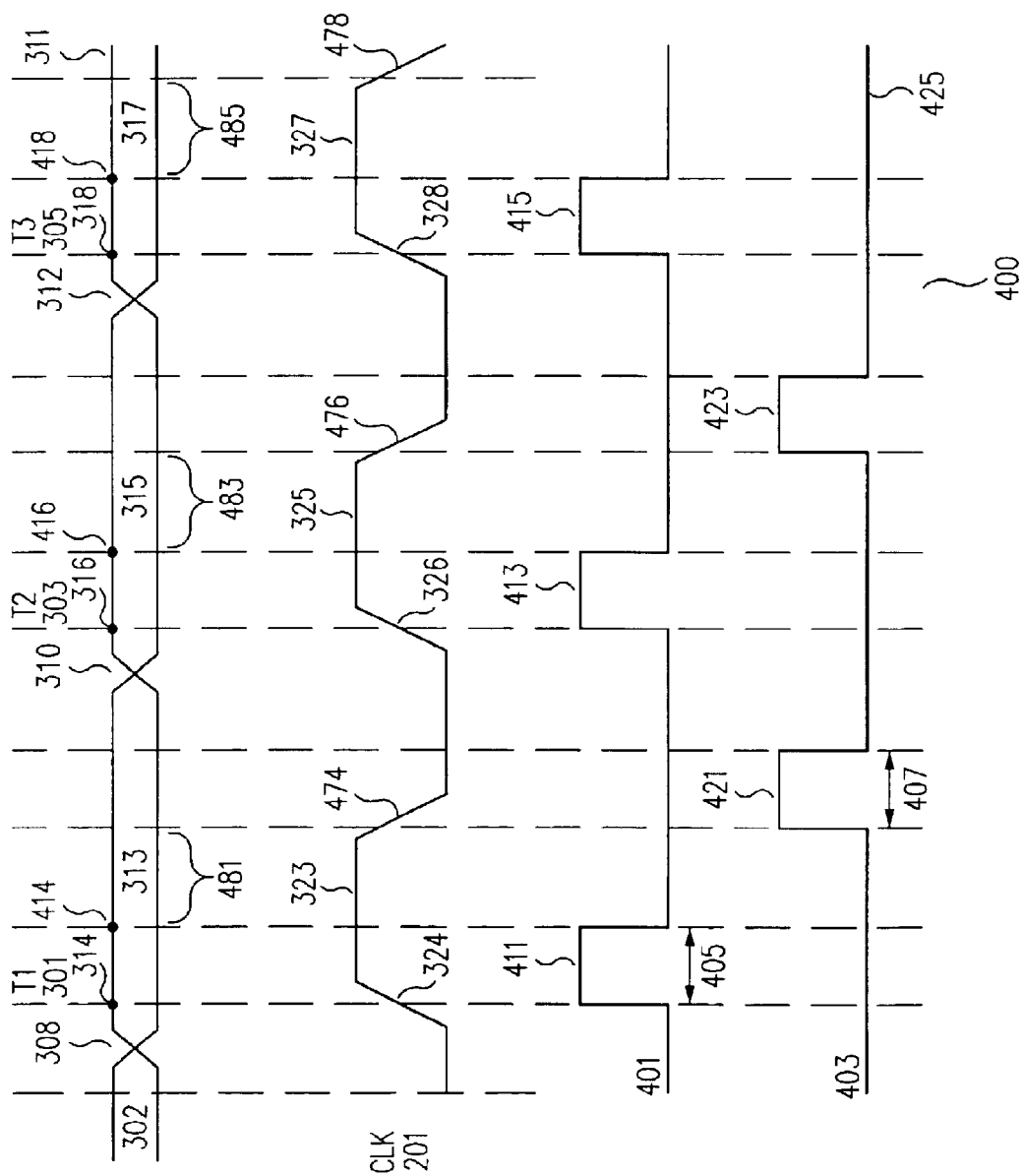
FIG. 4 shows one embodiment of the clock skew tolerant clocking scheme of the invention when employed with a typical synchronous data circuit design operating as designed, with little or no clock skew.
Figure 5:
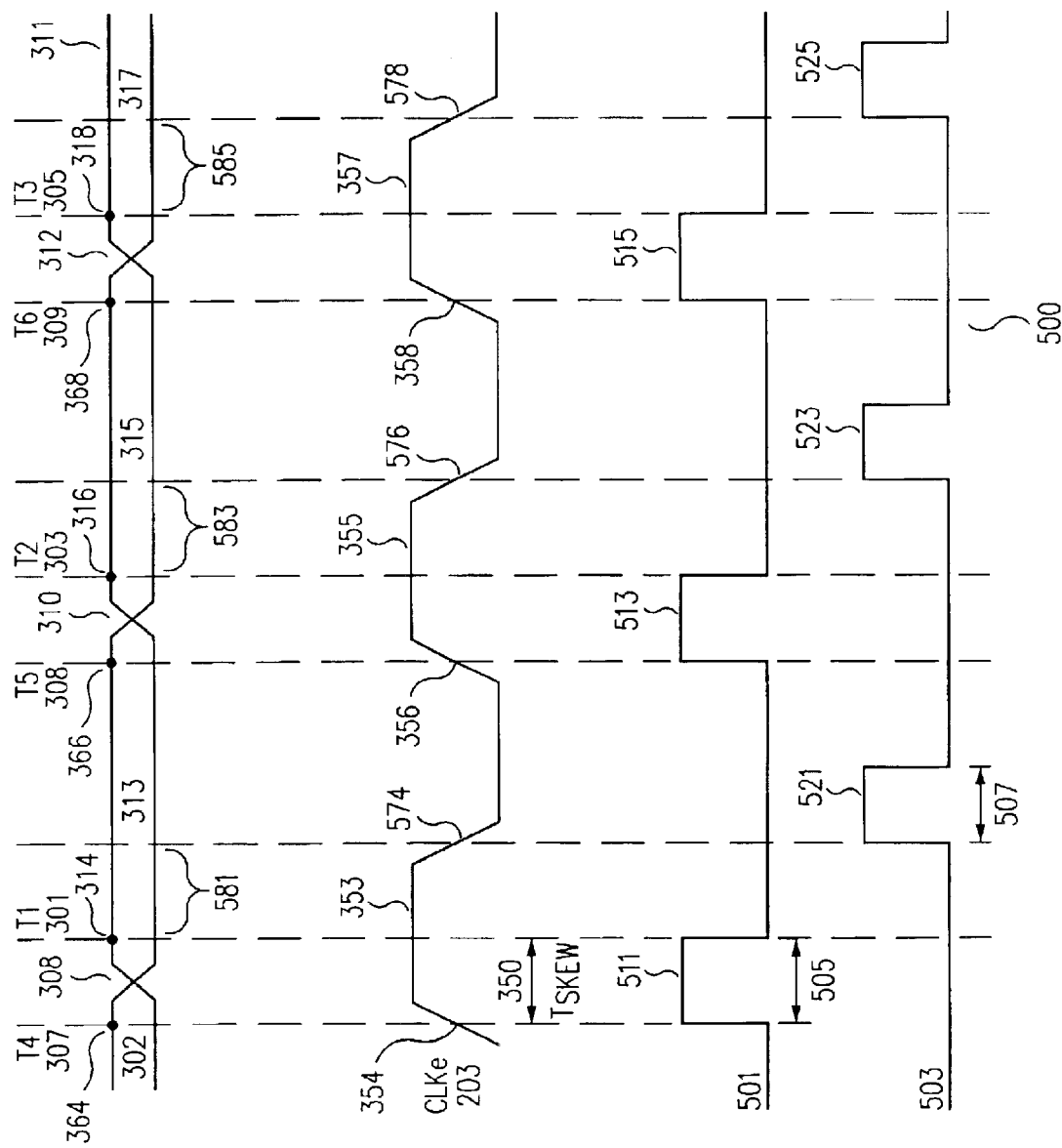
FIG. 5 shows one embodiment of the clock skew tolerant clocking scheme of the invention when employed to solve a max-time problem.

According to the present invention, a clock skew tolerant clocking scheme (400 in FIG. 4 and 500 in FIG. 5) addresses both the max-time and min-time problem by using dual transparent pulsed latches (601, 603 in FIG. 6) operated by complementary phases of the clock signal (201 in FIGS. 2 and 4 and 203 in FIGS. 2 and 5).

Figure 3:
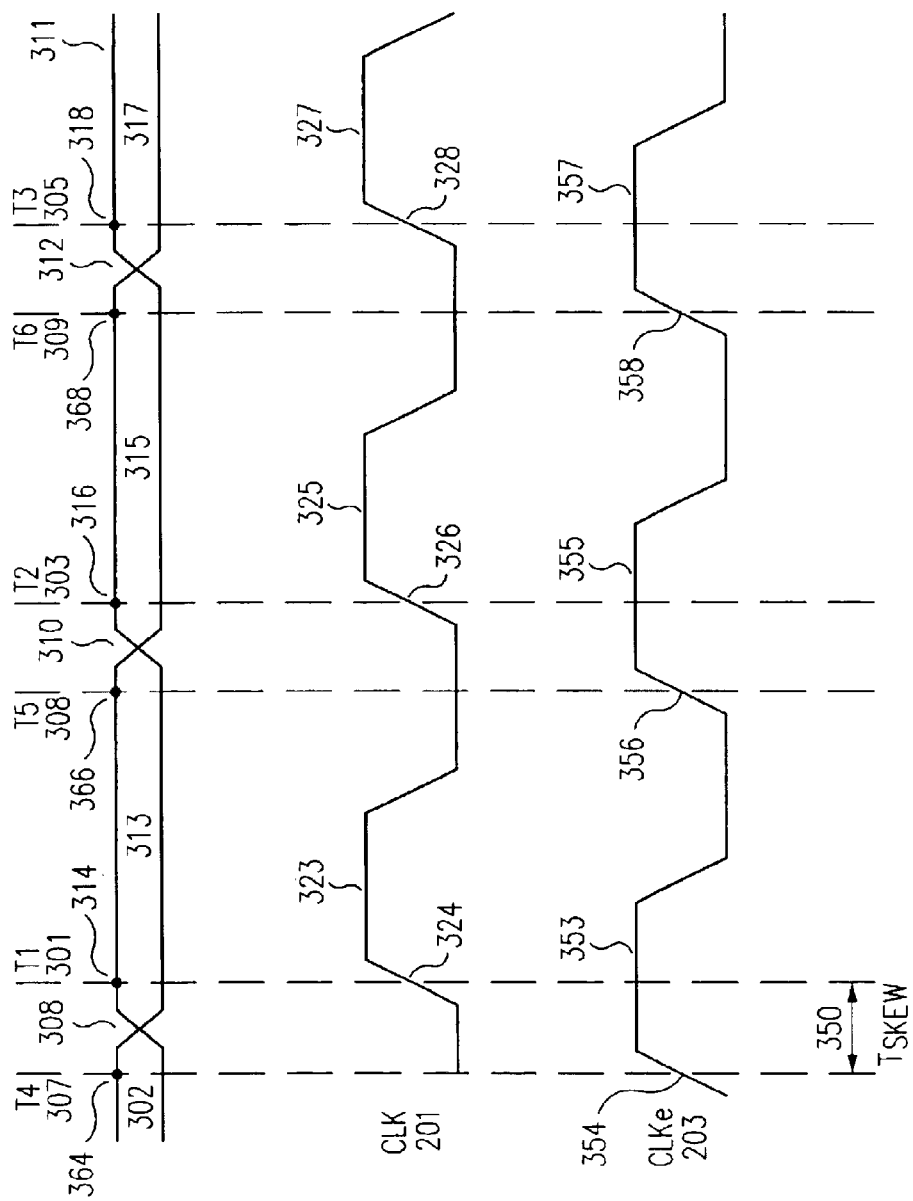
FIG. 3 shows a signal diagram for a typical synchronous data circuit design when operating as designed with little or no clock skew and where there is a max-time problem that reduces the maximum clocking frequency in a flip-flop based design.

According to the present invention, the first pulsed latch (601 in FIG. 6) is triggered by a first pulse (411, 413, and 415 in FIG. 4 and 511, 513 and 515 in FIG. 5) derived by the leading edge (324, 326, and 328 in FIGS. 3 and 4 and 354, 356 and 358 in FIGS. 3 and 5) of the clock signal pulse (323, 325, and 327 in FIGS. 3 and 4 and 353, 355 and 357 in FIGS. 3 and 5) and the second pulsed latch (603 in FIG. 6) is triggered by a second pulse (421, 423, and 425 in FIG. 4 and 521, 523 and 525 in FIG. 5) derived from the trailing edge (474, 476, and 478 in FIG. 4 and 574, 576 and 578 in FIG. 5) of the clock signal pulse (323, 325, and 327 in FIGS. 3 and 4 and 353, 355 and 357 in FIGS. 3 and 5). According to the present invention, the duration or pulse width (405 in FIG. 4 and 505 in FIG. 5) of the first pulse and the pulse width (407 in FIG. 4 and 507 in FIG. 5) of the second pulse is determined by the designer with longer or larger pulse widths being more tolerant of the max-time problem and the shorter or smaller pulse width being more tolerant of the min-time problem. In one embodiment of the invention, the pulse width of the first and second pulses is designed to be ten to twenty-five percent of a clock cycle.

By employing transparent latches, the clock skew tolerant clocking scheme of the invention is max-time clock skew tolerant and the wider the transparent period is made, i.e., the larger the pulse width, the more clock skew can be hidden. In addition, the wider the transparency period is made, the more time borrowing techniques can be employed. However, unlike the prior art latch based solutions to the max-time problem discussed above, the clock skew tolerant clocking scheme of the invention is also tolerant to min-time clocking skew problems as well. This is because, unlike prior art solutions, according to the invention, the transparency periods of the dual and complementary pulsed latches do not overlap and are separated by separation windows (481, 483, and 485 in FIG. 4 and 581, 583, and 585 in FIG. 5). Since the transparency periods of the dual and complementary pulsed latches are non-over-lapping, there is almost never a transparency period between two successive stages and, therefore, there is no opportunity to introduce racing conditions.

In one embodiment of the invention, the pulse width of the first and second pulses is twenty percent of the clock cycle. Consequently, to a first order, the clock skew tolerant clocking scheme of the invention can tolerate thirty percent (fifty percent of a clock cycle minus the twenty percent pulse width) of clock cycle skew without a min-time failure.

In addition, since, according to the invention, the first pulsed latch is triggered by a first pulse derived by the leading edge of the clock signal pulse and the second pulsed latch is triggered by a second pulse derived from the trailing edge of the clock signal, the min-time clock skew tolerance can be increased by changing the clock frequency since min-time skew tolerance, using the clock skew tolerant clocking scheme of the invention is determined by the clock cycle time divided by twice the pulse width of either the first and second pulses. Consequently, unlike prior art schemes where the min-time problem was frequency independent, using the clock skew tolerant clocking scheme of the invention, both the max-time and the min-time problems can be solved by adjusting the clock frequency. This feature of the clock skew tolerant clocking scheme of the invention is particularly advantageous during the system debugging phase of the design process since padding and margining for min-time is not required using clock skew tolerant clocking scheme of the invention.

FIG. 4 shows one embodiment of the clock skew tolerant clocking scheme 400 of the invention when employed with a typical synchronous data circuit design operating as designed, with little or no clock skew, such as the situation depicted in FIG. 3 and discussed above.

Shown again in FIG. 4 is the data stream 311 to be sampled including data packets 313, 315 and 317. Once again it is important to note that data stream 311 changes at points 308, 310, and 312 such that the data value in data packet 313 can be, and often is, different form the data value in data packet 315 or 317, i.e., the data value changes state from data packet 313 to data packet 315 and to data packet 317.

Also shown in FIG. 4 is clock signal CLK 201. As is typical in the present state of the art, signal diagram 400 is for an "edge triggered" system.

Also shown in FIG. 4 is first pulse signal 401 that includes first pulses 411, 413, and 415. In accordance with the present invention, first pulses 411, 413, and 415 are derived by the leading edges 324, 326 and 328 of clock pulses 323, 325, and 327 and are used to trigger a first pulsed latch (601 in FIG. 6) to provide a transparency window equal to the pulse width 405 of first pulses 411, 413, and 415.

Likewise, according to the invention, a second pulse signal 403 includes second pulses 421, 423, and 425. In accordance with the present invention, second pulses 421, 423, and 425 are derived by the trailing edges 474, 476 and 478 of clock signal pulses 323, 325 and 327 and are used to trigger a second pulsed latch (603 in FIG. 6) to provide a transparency window equal to the pulse width 407 of second pulses 421, 423, and 425.

Numerous methods for creating first pulse signal 401 and second pulse signal 403 are know to those of skill in the art. Consequently, the devices and methods for creating first pulse signal 401 and second pulse signal 403 are not discussed in detail herein to avoid detracting form the present invention.

As shown in FIG. 4, the clock skew tolerant clocking scheme 400 of the invention, including first pulse signal 401 and second pulse signal 403, shifts the data sampling points from the leading edges 324, 326 and 328, and the respective data stream points 314, 316 and 318, to data sampling points 414, 416 and 418. In addition, the separation windows 481, 483 and 485 are narrowed from a time equal to the entire pulse width of clock pulses 323, 325 and 327, equal one-half a clock cycle, to a time equal to the entire width of clock pulses 323, 325 and 327 minus the pulse width 405 of a first pulse 411 and the pulse width 407 of a second pulse 421.

In one embodiment of the invention, first pulse width 405 is equal to second pulse width 407. In this embodiment, separation windows 481, 483 and 485 are equal to one-half a clock cycle minus the pulse width 405 or 407 of the first or second data pulse 411 or 421.

According to the present invention, the duration or pulse width 405 of first pulses 411, 413 and 415 and second pulses 421, 423 and 425 is determined by the designer, with longer or larger pulse widths being more tolerant of the max-time problem and the shorter or smaller pulse width being more tolerant of the min-time problem. In one embodiment of the invention, the pulse widths 405, 407 of first and second pulses 411, 413 and 415 and 421, 423 and 425 are designed to be ten to twenty-five percent of a clock cycle.

As noted above, FIG. 4 shows one embodiment of the clock skew tolerant clocking scheme 400 of the invention employed with a typical synchronous data circuit design operating as designed, with little or no clock skew. Consequently, the effect of the clock skew tolerant clocking scheme 400 of the invention in FIG. 4 is minimal and the result is simply a narrowing of the valid data windows. FIG. 4 is included to show that the clock skew tolerant clocking scheme 400 of the invention can readily be employed with system where there is little or no clock skew without interfering with normal system operation. However, using clock skew tolerant clocking scheme 400 of the invention, the system is now more tolerate to potential clock skew when, and if, it arises.

FIG. 5 shows one embodiment of the clock skew tolerant clocking scheme 500 of the invention when employed to solve a max-time problem.

Shown in FIG. 5 is the data stream 311 to be sampled including data packets 302, 313, 315 and 317. Once again it is important to note that data stream 311 changes at points 308, 310, and 312 such that the data value in data packet 313 can be, and often is, different form the data value in data packet 302, data packet 315 or 317, i.e., the data value changes state from data packet 302 to data packet 313 to data packet 315 and to data packet 317.

Also shown in FIG. 5 is skewed clock signal CLKe 203. As discussed above, skewed clock signal CLKe 203 of FIG. 3 and FIG. 5 differs from clock signal CLK 201 of FIG. 3 and FIG. 4 in that a leading "trigger" edge 354 of clock pulse 353 is displaced or "skewed" early, or to the left, with respect to leading edge 324 of clock pulse 323 by skew time 350. Likewise, a leading "trigger" edge 356 of clock pulse 355 is displaced or "skewed" to the left with respect to leading edge 326 of clock pulse 325 by skew time 350. Likewise, a leading "trigger" edge 358 of clock pulse 357 is displaced or "skewed" to the left with respect to leading edge 328 of clock pulse 327 by skew time 350.

As discussed above, the max-time problem arises from the fact that because of skew time 350, leading edge 354 of clock pulse 353 of skewed clock signal CLKe 203 would cause data stream 311 to be sampled at point 364 of data packet 302, instead of a point, such as point 314, in the correct data packet 313. Consequently, data packet 302 would be incorrectly sampled instead of the correct data packet 313. Therefore, since the value of data packet 313 can be, and often is, different from the value of data packet 302, incorrect data would be sampled and used.

As shown in FIG. 5, a similar situation results for clock pulse 325 since, because of skew time 350, leading edge 356 of clock pulse 355 of skewed CLKe 203 would cause data stream 311 to be sampled at point 366 of data packet 313, instead of a point, such as point 316, in the correct data packet 315. Consequently, data packet 313 would be sampled instead of the correct data packet 315. Therefore, since the value of data packet 313 can be, and often is, different from the value of data packet 315, incorrect data would be sampled and used.

Finally, as also shown in FIG. 5, skew time 350, would cause sampling at point 368 of data packet 315 instead of a point, such as point 318 in the correct data packet 317. Consequently, data packet 315 would be sampled incorrectly instead of the correct data packet 317. Therefore, incorrect data would be sampled and used.

However, as also shown in FIG. 5, according to the invention, first pulse signal 501, that includes first pulses 511, 513, and 515, corrects this max-time problem. In accordance with the present invention, first pulses 511, 513, and 515 are derived by the leading edges 354, 356 and 358 of clock signal pulses 353, 355 and 357 and are used to trigger a first pulsed latch (601 in FIG. 6) to provide a transparency window equal to the pulse width 505 of first pulses 511, 513, and 515.

Likewise, according to the invention, a second pulse signal 503 includes second pulses 521, 523, and 525. In accordance with the present invention, second pulses 521, 523, and 525 are derived by the trailing edges 574, 576 and 578 of clock signal pulses 353, 355 and 357 and are used to trigger a second pulsed latch (603 in FIG. 6) to provide a transparency window equal to the pulse width 507 of second pulses 521, 523, and 525.

As shown in FIG. 5, the clock skew tolerant clocking scheme 500 of the invention, including first pulse signal 501 and second pulse signal 503 shifts the data sampling points from data stream points 364, 366 and 368 to data stream points 314, 316 and 318, respectively. Consequently, using the clock skew tolerant clocking scheme 500 of the invention, skew time 350 falls within the transparency window supplied by the pulse width 505 of first pulse 511 and data stream 311 is sampled point 314, in the correct data packet 313. Likewise, skew time 350 falls within the transparency window supplied by the pulse width 505 of first pulse 513 and data stream 311 is sampled at point 316, in the correct data packet 315. Likewise, skew time 350 falls within the transparency window supplied by the pulse width 505 of first pulse 515 and data stream 311 is sampled at point 318 in the correct data packet 317. Therefore, using the clock skew tolerant clocking scheme 500 of the invention, the max-time problem is solved.

In addition, the clock skew tolerant clocking scheme 500 of the invention creates separation windows 581, 583 and 585 between transparency windows and data sampling times are changed from time T4, T5 and T6 to times T1, T2 and T3, respectively.

In one embodiment of the invention, first pulse width 505 is equal to second pulse width 507. In this embodiment, the separation windows 581, 583 and 585 are equal to one-half a clock cycle minus the pulse width (505, 507) of the first or second data pulse.

According to the present invention, the duration or pulse width 505 of first pulses 511, 513 and 515 and second pulses 521, 523 and 525 is determined by the designer, with longer, or larger, pulse widths being more tolerant of the max-time problem and the shorter, or smaller, pulse widths being more tolerant of the min-time problem. In one embodiment of the invention, the pulse widths 505, 507 of first and second pulses 511, 513 and 515 and 521, 523 and 525 are designed to be ten to twenty-five percent of a clock cycle.

As discussed above, in the prior art, one solution for the max-time problem was to simply slow down the clock signal frequency to the point that uncertainty in the clock arrival did not result in circuit failure. Obviously, slowing down the clock signal frequency had adverse effects on performance and was very undesirable. As shown above, the clock skew tolerant clocking scheme 500 of the invention solves the max-time problem without the need to slow down the clock signal frequency. Consequently, the clock skew tolerant clocking scheme 500 of the invention solves the max-time problem without adversely effecting system performance.

Also recall that another prior art solution to the max-time problem in latch-based designs was to employ "transparent" latches between stages. However, as also discussed below, this prior art solution to the max-time time problem failed to address the min-time problem and potentially made the min-time problem even worse. However, as shown in FIG. 5, the clock skew tolerant clocking scheme 500 of the invention, including first pulse signal 501 and second pulse signal 503, provides that there is minimal opportunity for the first pulses 511, 513, and 515 to overlap with their corresponding second pulses 521, 523 and 525 since there is always a separation window 581, 583, and 585, equal to one-half a clock cycle minus the pulse width of a first pulse between the trailing edge of a first pulse 511, 513 and 515 and the leading edge of a corresponding second pulse 521, 523 and 525, respectively. Consequently, using the clock skew tolerant clocking scheme 500 of the invention there is minimal opportunity for the min-time problem to present itself, i.e., using the clock skew tolerant clocking scheme 500 of the invention, the min-time problem can only present it self if the clock skew exceeds the separation windows 581, 583, 585, equal to one-half a clock cycle minus the pulse width of the first pulse 505. This would be an extreme and very rare level of skew.

In addition, even in the rare circumstance where there was such an extreme skew present, using the clock skew tolerant clocking scheme 500 of the invention including first pulse signal 501 and second pulse signal 503, the min-time problem can, unlike in the prior art, be solved by simply slowing down the clock signal frequency since this will increase the separation windows 581, 583 and 585.

Figure 6:
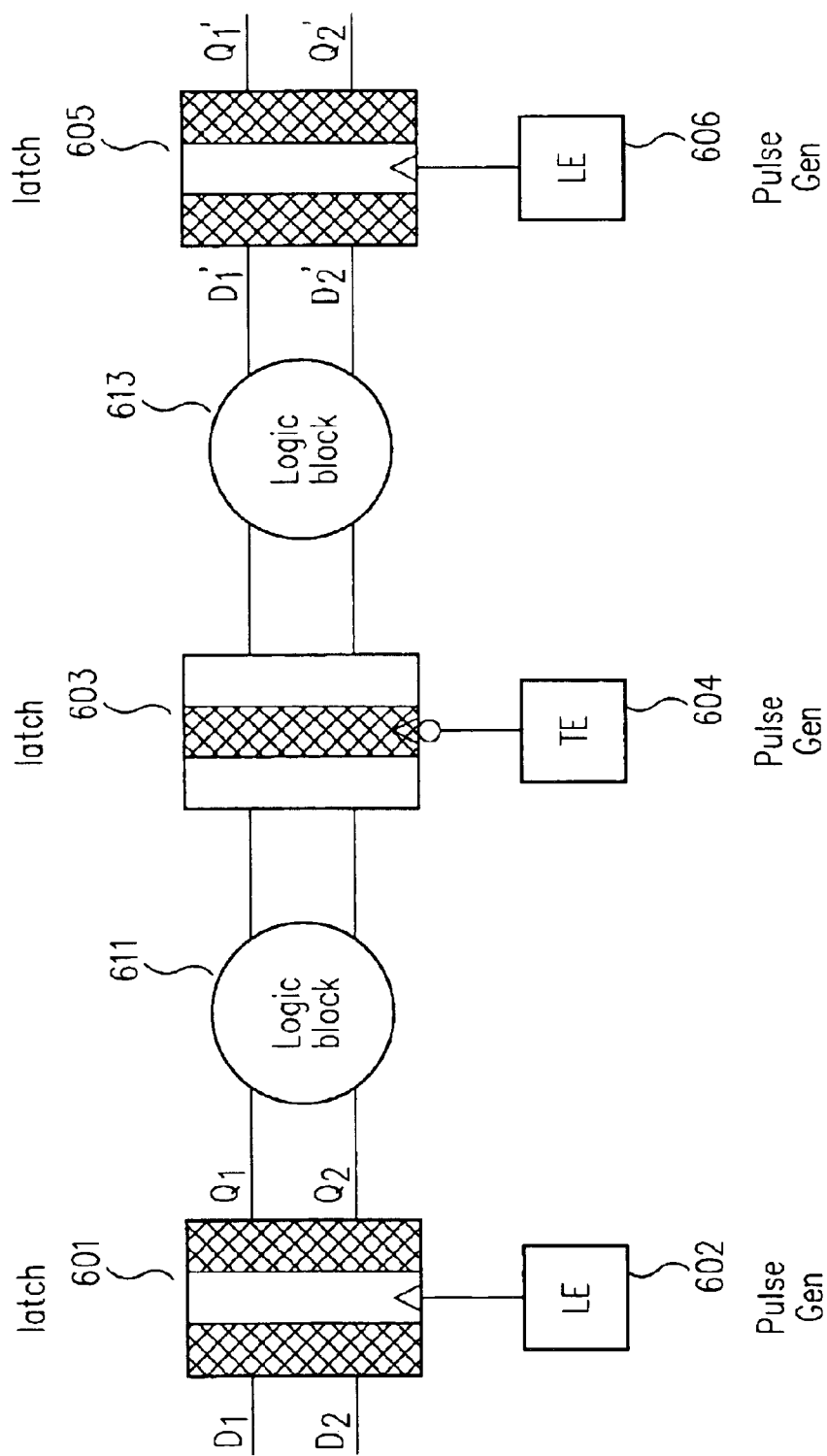
FIG. 6 shows one embodiment of a dual transparent pulsed latches operated by complementary phases of the clock signal in accordance with one embodiment of the invention.

FIG. 6 shows one embodiment of dual transparent pulsed latches (601 and 603) operated by complementary phases of the clock signal in accordance with one embodiment of the invention. As shown in FIG. 6, in one embodiment of the invention, a first pulse latch 601 includes a first pulse generator 602 for producing a first pulse, such as first pulses 411, 413 and 415 in FIG. 4 and 511, 513 and 515 in FIG. 5, derived from the rising edge of a clock pulse. Also shown in FIG. 6 is a second pulse latch 603 including a second pulse generator 604 for producing a second pulse, such as second pulses 421, 423 and 425 in FIG. 4 and 521, 523 and 525 in FIG. 5, derived from the trailing edge of a clock pulse. Logic block 611 is coupled between pulse latches 601 and 603. Likewise, logic block 613 is coupled between second pulse latch 603 and third pulse latch 605. According to one embodiment of the invention, third pulse latch 605, like first pulse latch 601, includes a first pulse generator 606 for producing a first pulse, such as first pulses 411, 413 and 415 in FIG. 4 and 511, 513 and 515 in FIG. 5, derived from the rising edge of a clock pulse.

Pulse latches and their operation are well known to those of skill in the art. Consequently, the structure and methods of pulse latches is not discussed in more detail herein to avoid detracting from the present invention. For a more detailed discussion of pulse latches the reader is referred to virtually any computer engineering text book. For example, "THE COMPUTER ENGINEERING HANDBOOK", edited by Vojin G. Oklobdzija, CRC press 2002, ISBN 0-8493-0885-1, see chapter 10.2 "LATCHES AND FLIP-FLOPS", authored by the present inventor, pages 10–35 to 10–52.

As shown in FIG. 6, in one embodiment of the invention, the first and second pulses are generated locally by pulse generators 602, 604 and 606 and therefore, in one embodiment of the invention, the system remains a single-phase system and there is no need to distribute additional signals widely.

As discussed above, according to the present invention, a clock skew tolerant clocking scheme addresses both the max-time and min-time problem by using dual transparent pulsed latches operated by complementary phases of the clock signal. According to the present invention, a first pulsed latch is triggered by a first pulse derived by the leading edge of the clock signal pulse and the second pulsed latch is triggered by a second pulse derived from the trailing edge of the clock signal. According to the present invention, the duration, or pulse width, of the first pulse and the second pulse is determined by the designer with longer, or larger, pulse widths being more tolerant of the max-time problem and shorter, or smaller, pulse widths being more tolerant of the min-time problem.

By employing transparent pulse latches, the clock skew tolerant clocking scheme of the invention is max-time clock skew tolerant and the wider the transparent period is made, i.e., the larger the pulse width, the more clock skew can be hidden. In addition, the wider the transparency period is made, the more time borrowing techniques can be employed.

Unlike the prior art latch-based solutions to the max-time problem discussed above, the clock skew tolerant clocking scheme of the invention is also tolerant to min-time clocking skew problems as well. This is because, unlike prior art solutions, according to the invention, the transparency periods of the dual and complementary pulsed latches are always separated by a separation window and do not overlap and since the transparency periods of the dual and complementary pulsed latches are non-over-lapping, there is almost never a transparency period between two successive stages and, therefore, there is no opportunity to introduce racing conditions.

In one embodiment of the invention, the pulse width of the first and second pulses is twenty percent of the clock cycle. Consequently, to a first order, the clock skew tolerant clocking scheme of the invention can tolerate thirty percent (fifty percent of a clock cycle minus the twenty percent pulse width) of clock cycle skew without a min-time failure.

In addition, since, according to the invention, the first pulsed latch is triggered by a first pulse derived by the leading edge of the clock signal pulse and the second pulsed latch is triggered by a second pulse derived from the trailing edge of the clock signal, the min-time clock skew tolerance can be increased by changing the clock frequency since min-time skew tolerance, using the clock skew tolerant clocking scheme of the invention is determined by the clock cycle time divided by twice the pulse width of either the first and second pulses. Consequently, unlike prior art schemes where the min-time problem was frequency independent, using the clock skew tolerant clocking scheme of the invention, both the max-time and the min-time problems can be solved by adjusting the clock frequency. This feature of the clock skew tolerant clocking scheme of the invention is particularly advantageous during the system debugging phase of the design process since padding and margining for min-time is not required using clock skew tolerant clocking scheme of the invention.

In addition, in one embodiment of the invention, the first and second pulses are generated locally by pulse generators and therefore, in one embodiment of the invention, the system remains a single-phase system and there is no need to distribute additional signals widely.

The foregoing description of an implementation of the invention has been presented for purposes of illustration and description only, and therefore is not exhaustive and does not limit the invention to the precise form disclosed. Modifications and variations are possible in light of the above teachings or may be acquired from practicing the invention.

Consequently, the scope of the invention is defined by the claims and their equivalents.

What is claimed is:

1. A clock skew tolerant clocking scheme comprising:
a data stream;
a clock signal, said clock signal having a clock cycle, said clock signal comprising a plurality of clock pulses, each of said clock pulses of said plurality of clock pulses comprising a clock pulse rising edge and a clock pulse falling edge and a clock pulse width between said clock pulse rising edge and said clock pulse falling edge;
a first pulse signal, said first pulse signal comprising a plurality of first pulses, each of said first pulses of said plurality of first pulses comprising a first pulse rising edge and a first pulse falling edge and a first pulse width between said first pulse rising edge and said first pulse falling edge, said first pulse signal being generated by a first local pulse generator, said first pulse signal being derived from said clock signal such that each of said first pulses of said plurality of first pulses corresponds to one of said clock pulses of said plurality of clock pulses and each of said first pulse rising edges of said first pulses are generated by a corresponding clock pulse rising edge of said corresponding one of said plurality of clock pulses, said first pulse width being less than fifty percent of said clock pulse width;
a second pulse signal, said second pulse signal comprising a plurality of second pulses, each of said second pulses of said plurality of second pulses comprising a second pulse rising edge and a second pulse falling edge and a second pulse width between said second pulse rising edge and said second pulse falling edge, said second pulse signal being generated by a second local pulse generator, said second pulse signal being derived from said clock signal such that each of said second pulses of said plurality of second pulses corresponds to one of said clock pulses of said plurality of clock pulses and each of said second pulse rising edges of said second pulses are generated by a corresponding clock pulse falling edge of said corresponding one of said plurality of clock pulses, said second pulse width being less than fifty percent of said clock pulse width;

a first transparent pulse latch, said first pulse signal being operatively coupled to said first transparent pulse latch;

a second transparent pulse latch, said second pulse signal being operatively coupled to said second transparent pulse latch; wherein, for each clock pulse of said plurality of clock pulses of said clock signal there is a first pulse of said plurality of first pulses of said first pulse signal generated by a rising edge of said clock pulse and a corresponding second pulse of said plurality of second pulses of said second pulse signal generated by a falling edge of said clock pulse; further wherein, there is a frequency dependent separation window between a falling edge of said first pulse and rising edge of said corresponding second pulse such that race conditions are avoided.

2. The clock skew tolerant clocking scheme of claim 1; wherein, said first pulse width is ten to twenty-five percent of said clock cycle.

3. The clock skew tolerant clocking scheme of claim 1; wherein, said first pulse width is twenty percent of said clock cycle.

4. The clock skew tolerant clocking scheme of claim 1; wherein, said second pulse width is ten to twenty-five percent of said clock cycle.

5. The clock skew tolerant clocking scheme of claim 1; wherein, said second pulse width is twenty percent of said clock cycle.

6. The clock skew tolerant clocking scheme of claim 1; wherein, said first pulse width is equal to said second pulse width.

7. The clock skew tolerant clocking scheme of claim 6; wherein, said first pulse width and said second pulse width are ten to twenty-five percent of said clock cycle.

8. The clock skew tolerant clocking scheme of claim 6; wherein, said first pulse width and said second pulse width are twenty percent of said clock cycle.

9. The clock skew tolerant clocking scheme of claim 1; wherein, said first pulse signal is generated by a first local pulse generator operatively coupled to said first transparent pulse latch; and said second pulse signal is generated by a second local pulse generator operatively coupled to said second transparent pulse latch.

10. A method for clocking combinational logic blocks said method comprising:

providing a data stream;

generating a clock signal, said clock signal having a clock cycle, said clock signal comprising a plurality of clock pulses, each of said clock pulses of said plurality of clock pulses comprising a clock pulse rising edge and a clock pulse falling edge and a clock pulse width between said clock pulse rising edge and said clock pulse falling edge;

generating a first pulse signal, said first pulse signal comprising a plurality of first pulses, each of said first pulses of said plurality of first pulses comprising a first pulse rising edge and a first pulse falling edge and a first pulse width between said first pulse rising edge and said first pulse falling edge, said first pulse signal being generated by a first local pulse generator, said first pulse signal being derived from said clock signal such that each of said first pulses of said plurality of first pulses corresponds to one of said clock pulses of said plurality of clock pulses and each of said first pulse rising edges of said first pulses are generated by a corresponding clock pulse rising edge of said corresponding one of said plurality of clock pulses, said first pulse width being less than fifty percent of said clock pulse width;

generating a second pulse signal, said second pulse signal comprising a plurality of second pulses, each of said second pulses of said plurality of second pulses comprising a second pulse rising edge and a second pulse falling edge and a second pulse width between said second pulse rising edge and said second pulse falling edge, said second pulse signal being generated by a second local pulse generator, said second pulse signal being derived from said clock signal such that each of said second pulses of said plurality of second pulses corresponds to one of said clock pulses of said plurality of clock pulses and each of said second pulse rising edges of said second pulses are generated by a corresponding clock pulse falling edge of said corresponding one of said plurality of clock pulses, said second pulse width being less than fifty percent of said clock pulse width;

operatively coupling a first transparent pulse latch, to said first pulse signal;

operatively coupling a second transparent pulse latch to said second pulse signal;

ensuring that for each clock pulse of said plurality of clock pulses of said clock signal there is a first pulse of said plurality of first pulses of said first pulse signal generated by a rising edge of said clock pulse and a corresponding second pulse of said plurality of second pulses of said second pulse signal generated by a falling edge of said clock pulse; wherein, there is a frequency dependent separation window between a falling edge of said first pulse and rising edge of said corresponding second pulse such that race conditions are avoided.

11. The method for clocking combinational logic blocks of claim 10; wherein, said first pulse width is ten to twenty-five percent of said clock cycle.

12. The method for clocking combinational logic blocks of claim 10; wherein, said first pulse width is twenty percent of said clock cycle.

13. The method for clocking combinational logic blocks of claim 10; wherein, said second pulse width is ten to twenty-five percent of said clock cycle.

14. The method for clocking combinational logic blocks of claim 10; wherein, said second pulse width is twenty percent of said clock cycle.

15. The method for clocking combinational logic blocks of claim 10; wherein,
said first pulse width is equal to said second pulse width.

16. The method for clocking combinational logic blocks of claim 15; wherein,
said first pulse width and said second pulse width are ten to twenty-five percent of said clock cycle.

17. The method for clocking combinational logic blocks of claim 15; wherein,
said first pulse width and said second pulse width are twenty percent of said clock cycle.

18. The method for clocking combinational logic blocks of claim 10; wherein,
said first pulse signal is generated by a first local pulse generator operatively coupled to said first transparent pulse latch; and
said second pulse signal is generated by a second local pulse generator operatively coupled to said second transparent pulse latch.

19. A method for creating a clock skew tolerate computer pipeline comprising;
providing a plurality of pipeline stages, each of said stages comprising combinational logic blocks, for each of said combinational logic blocks:
providing a data stream;
generating a clock signal, said clock signal having a clock cycle, said clock signal comprising a plurality of clock pulses, each of said clock pulses of said plurality of clock pulses comprising a clock pulse rising edge and a clock pulse falling edge and a clock pulse width between said clock pulse rising edge and said clock pulse falling edge;
generating a first pulse signal, said first pulse signal comprising a plurality of first pulses, each of said first pulses of said plurality of first pulses comprising a first pulse rising edge and a first pulse falling edge and a first pulse width between said first pulse rising edge and said first pulse falling edge, said first pulse signal being generated by a first local pulse generator, said first pulse signal being derived from said clock signal such that each of said first pulses of said plurality of first pulses corresponds to one of said clock pulses of said plurality of clock pulses and each of said first pulse rising edges of said first pulses are generated by a corresponding clock pulse rising edge of said corresponding one of said plurality of clock pulses, said first pulse width being less than fifty percent of said clock pulse width;
generating a second pulse signal, said second pulse signal comprising a plurality of second pulses, each of said second pulses of said plurality of second pulses comprising a second pulse rising edge and a second pulse falling edge and a second pulse width between said second pulse rising edge and said second pulse falling edge, said second pulse signal being generated by a second local pulse generator, said second pulse signal being derived from said clock signal such that each of said second pulses of said plurality of second pulses corresponds to one of said clock pulses of said plurality of clock pulses and each of said second pulse rising edges of said second pulses are generated by a corresponding clock pulse falling edge of said corresponding one of said plurality of clock pulses, said second pulse width being less than fifty percent of said clock pulse width;
operatively coupling a first transparent pulse latch, to said first pulse signal;
operatively coupling a second transparent pulse latch to said second pulse signal;
ensuring that for each clock pulse of said plurality of clock pulses of said clock signal there is a first pulse of said plurality of first pulses of said first pulse signal generated by a rising edge of said clock pulse and a corresponding second pulse of said plurality of second pulses of said second pulse signal generated by a falling edge of said clock pulse; wherein,
there is a frequency dependent separation window between a falling edge of said first pulse and rising edge of said corresponding second pulse such that race conditions are avoided.

20. The method of claim 19; wherein,
said first pulse width is ten to twenty-five percent of said clock cycle.

21. The method of claim 19; wherein,
said first pulse width is twenty percent of said clock cycle.

22. The method of claim 19; wherein,
said second pulse width is ten to twenty-five percent of said clock cycle.

23. The method of claim 19; wherein,
said second pulse width is twenty percent of said clock cycle.

24. The method of claim 19; wherein,
said first pulse width is equal to said second pulse width.

25. The method of claim 24; wherein,
said first pulse width and said second pulse width are ten to twenty-five percent of said clock cycle.

26. The method of claim 24; wherein,
said first pulse width and said second pulse width are twenty percent of said clock cycle.

27. A clock skew tolerant clocking scheme comprising:
a data stream;
a clock signal, said clock signal having a clock cycle, said clock signal comprising a plurality of clock pulses, each of said clock pulses of said plurality of clock pulses comprising a clock pulse falling edge and a clock pulse rising edge and a clock pulse width between said clock pulse falling edge and said clock pulse rising edge;
a first pulse signal, said first pulse signal comprising a plurality of first pulses, each of said first pulses of said plurality of first pulses comprising a first pulse rising edge and a first pulse falling edge and a first pulse width between said first pulse rising edge and said first pulse falling edge, said first pulse signal being generated by a first local pulse generator, said first pulse signal being derived from said clock signal such that each of said first pulses of said plurality of first pulses corresponds to one of said clock pulses of said plurality of clock pulses and each of said first pulse rising edges of said first pulses are generated by a corresponding clock pulse falling edge of said corresponding one of said plurality of clock pulses, said first pulse width being less than fifty percent of said clock pulse width;
a second pulse signal, said second pulse signal comprising a plurality of second pulses, each of said second pulses of said plurality of second pulses comprising a second pulse rising edge and a second pulse falling edge and a second pulse width between said second pulse rising edge and said second pulse falling edge, said second pulse signal being generated by a second local pulse generator, said second pulse signal being derived from said clock signal such that each of said second pulses of said plurality of second pulses corresponds to one of said clock pulses of said plurality of clock pulses and each of said second pulse rising edges of said second pulses are generated by a corresponding clock pulse rising edge of said corresponding one of said plurality of clock pulses, said second pulse width being less than fifty percent of said clock pulse width;

a first transparent pulse latch, said first pulse signal being operatively coupled to said first transparent pulse latch;

a second transparent pulse latch, said second pulse signal being operatively coupled to said second transparent pulse latch; wherein, for each clock pulse of said plurality of clock pulses of said clock signal there is a first pulse of said plurality of first pulses of said first pulse signal generated by a falling edge of said clock pulse and a corresponding second pulse of said plurality of second pulses of said second pulse signal generated by a rising edge of said clock pulse; further wherein, there is a frequency dependent separation window between a falling edge of said first pulse and rising edge of said corresponding second pulse such that race conditions are avoided.

28. A method for clocking combinational logic blocks said method comprising:

providing a data stream;

generating a clock signal, said clock signal having a clock cycle, said clock signal comprising a plurality of clock pulses, each of said clock pulses of said plurality of clock pulses comprising a clock pulse falling edge and a clock pulse rising edge and a clock pulse width between said clock pulse falling edge and said clock pulse rising edge;

generating a first pulse signal, said first pulse signal comprising a plurality of first pulses, each of said first pulses of said plurality of first pulses comprising a first pulse rising edge and a first pulse falling edge and a first pulse width between said first pulse rising edge and said first pulse falling edge, said first pulse signal being generated by a first local pulse generator, said first pulse signal being derived from said clock signal such that each of said first pulses of said plurality of first pulses corresponds to one of said clock pulses of said plurality of clock pulses and each of said first pulse rising edges of said first pulses are generated by a corresponding clock pulse tailing edge of said corresponding one of said plurality of clock pulses, said first pulse width being less than fifty percent of said clock pulse width;

generating a second pulse signal, said second pulse signal comprising a plurality of second pulses, each of said second pulses of said plurality of second pulses comprising a second pulse rising edge and a second pulse falling edge and a second pulse width between said second pulse rising edge and said second pulse falling edge, said second pulse signal being generated by a second local pulse generator, said second pulse signal being derived from said clock signal such that each of said second pulses of said plurality of second pulses corresponds to one of said clock pulses of said plurality of clock pulses and each of said second pulse rising edges of said second pulses are generated by a corresponding clock pulse rising edge of said corresponding one of said plurality of clock pulses, said second pulse width being less than fifty percent of said clock pulse width;

operatively coupling a first transparent pulse latch, to said first pulse signal;

operatively coupling a second transparent pulse latch to said second pulse signal;

ensuring that for each clock pulse of said plurality of clock pulses of said clock signal there is a first pulse of said plurality of first pulses of said first pulse signal generated by a falling edge of said clock pulse and a corresponding second pulse of said plurality of second pulses of said second pulse signal generated by a rising edge of said clock pulse; wherein, there is a frequency dependent separation window between a falling edge of said first pulse and rising edge of said corresponding second pulse such that race conditions are avoided.

29. A method for creating a clock skew tolerate computer pipeline comprising;

providing a plurality of pipeline stages, each of said stages comprising combinational logic blocks, for each of said combinational logic blocks:

providing a data stream;

generating a clock signal, said clock signal having a clock cycle, said clock signal comprising a plurality of clock pulses, each of said clock pulses of said plurality of clock pulses comprising a clock pulse falling edge and a clock pulse rising edge and a clock pulse width between said clock pulse falling edge and said clock pulse rising edge;

generating a first pulse signal, said first pulse signal comprising a plurality of first pulses, each of said first pulses of said plurality of first pulses comprising a first pulse rising edge and a first pulse falling edge and a first pulse width between said first pulse rising edge and said first pulse falling edge, said first pulse signal being generated by a first local pulse generator, said first pulse signal being derived from said clock signal such that each of said first pulses of said plurality of first pulses corresponds to one of said clock pulses of said plurality of clock pulses and each of said first pulse rising edges of said first pulses are generated by a corresponding clock pulse falling edge of said corresponding one of said plurality of clock pulses, said first pulse width being less than fifty percent of said clock pulse width;

generating a second pulse signal, said second pulse signal comprising a plurality of second pulses, each of said second pulses of said plurality of second pulses comprising a second pulse rising edge and a second pulse falling edge and a second pulse width between said second pulse rising edge and said second pulse falling edge, said second pulse signal being generated by a second local pulse generator, said second pulse signal being derived from said clock signal such that each of said second pulses of said plurality of second pulses corresponds to one of said clock pulses of said plurality of clock pulses and each of said second pulse rising edges of said second pulses are generated by a corresponding clock pulse rising edge of said corresponding one of said plurality of clock pulses, said second pulse width being less than fifty percent of said clock pulse width;

operatively coupling a first transparent pulse latch, to said first pulse signal;

operatively coupling a second transparent pulse latch to said second pulse signal;

ensuring that for each clock pulse of said plurality of clock pulses of said clock signal there is a first pulse of said plurality of first pulses of said first pulse signal generated by a falling edge of said clock pulse and a corresponding second pulse of said plurality of second pulses of said second pulse signal generated by a rising edge of said clock pulse; wherein, there is a frequency dependent separation window between a falling edge of said first pulse and rising edge of said corresponding second pulse such that race conditions are avoided.

30. A clock skew tolerant clocking scheme comprising:
a data stream;
a clock signal, said clock signal having a clock cycle, said clock signal comprising a plurality of clock pulses, each of said clock pulses of said plurality of clock pulses comprising a clock pulse first edge and a clock pulse second edge and a clock pulse width between said clock pulse first edge and said clock pulse second edge;
a first pulse signal, said first pulse signal comprising a plurality of first pulses, each of said first pulses of said plurality of first pulses comprising a first pulse first edge and a first pulse second edge and a first pulse width between said first pulse first edge and said first pulse second edge, said first pulse signal being generated by a first local pulse generator, said first pulse signal being derived from said clock signal such that each of said first pulses of said plurality of first pulses corresponds to one of said clock pulses of said plurality of clock pulses and each of said first pulse first edges of said first pulses are generated by a corresponding clock pulse first edge of said corresponding one of said plurality of clock pulses, said first pulse width being less than fifty percent of said clock pulse width;
a second pulse signal, said second pulse signal comprising a plurality of second pulses, each of said second pulses of said plurality of second pulses comprising a second pulse first edge and a second pulse second edge and a second pulse width between said second pulse first edge and said second pulse second edge, said second pulse signal being generated by a second local pulse generator, said second pulse signal being derived from said clock signal such that each of said second pulses of said plurality of second pulses corresponds to one of said clock pulses of said plurality of clock pulses and each of said second pulse first edges of said second pulses are generated by a corresponding clock pulse second edge of said corresponding one of said plurality of clock pulses, said second pulse width being less than fifty percent of said clock pulse width;
a first transparent pulse latch, said first pulse signal being operatively coupled to said first transparent pulse latch;
a second transparent pulse latch, said second pulse signal being operatively coupled to said second transparent pulse latch; wherein,
for each clock pulse of said plurality of clock pulses of said clock signal there is a first pulse of said plurality of first pulses of said first pulse signal generated by a first edge of said clock pulse and a corresponding second pulse of said plurality of second pulses of said second pulse signal generated by a second edge of said clock pulse; further wherein,
there is a frequency dependent separation window between a second edge of said first pulse and first edge of said corresponding second pulse such that race conditions are avoided.

31. A method for clocking combinational logic blocks said method comprising:
providing a data stream;
generating a clock signal, said clock signal having a clock cycle, said clock signal comprising a plurality of clock pulses, each of said clock pulses of said plurality of clock pulses comprising a clock pulse first edge and a clock pulse second edge and a clock pulse width between said clock pulse first edge and said clock pulse second edge;
generating a first pulse signal, said first pulse signal comprising a plurality of first pulses, each of said first pulses of said plurality of first pulses comprising a first pulse first edge and a first pulse second edge and a first pulse width between said first pulse first edge and said first pulse second edge, said first pulse signal being generated by a first local pulse generator, said first pulse signal being derived from said clock signal such that each of said first pulses of said plurality of first pulses corresponds to one of said clock pulses of said plurality of clock pulses and each of said first pulse first edges of said first pulses are generated by a corresponding clock pulse first edge of said corresponding one of said plurality of clock pulses, said first pulse width being less than fifty percent of said clock pulse width;
generating a second pulse signal, said second pulse signal comprising a plurality of second pulses, each of said second pulses of said plurality of second pulses comprising a second pulse first edge and a second pulse second edge and a second pulse width between said second pulse first edge and said second pulse second edge, said second pulse signal being generated by a second local pulse generator, said second pulse signal being derived from said clock signal such that each of said second pulses of said plurality of second pulses corresponds to one of said clock pulses of said plurality of clock pulses and each of said second pulse first edges of said second pulses are generated by a corresponding clock pulse second edge of said corresponding one of said plurality of clock pulses, said second pulse width being less than fifty percent of said clock pulse width;
operatively coupling a first transparent pulse latch, to said first pulse signal;
operatively coupling a second transparent pulse latch to said second pulse signal;
ensuring that for each clock pulse of said plurality of clock pulses of said clock signal there is a first pulse of said plurality of first pulses of said first pulse signal generated by a first edge of said clock pulse and a corresponding second pulse of said plurality of second pulses of said second pulse signal generated by a second edge of said clock pulse; wherein,
there is a frequency dependent separation window between a second edge of said first pulse and first edge of said corresponding second such that race conditions are avoided.

32. A method for creating a clock skew tolerate computer pipeline comprising;
providing a plurality of pipeline stages, each of said stages comprising combinational logic blocks, for each of said combinational logic blocks:
providing a data stream;
generating a clock signal, said clock signal having a clock cycle, said clock signal comprising a plurality of clock pulses, each of said clock pulses of said plurality of clock pulses comprising a clock pulse first edge and a clock pulse second edge and a clock pulse width between said clock pulse first edge and said clock pulse second edge;

generating a first pulse signal, said first pulse signal comprising a plurality of first pulses, each of said first pulses of said plurality of first pulses comprising a first pulse first edge and a first pulse second edge and a first pulse width between said first pulse first edge and said first pulse second edge, said first pulse signal being generated by a first local pulse generator, said first pulse signal being derived from said clock signal such that each of said first pulses of said plurality of first pulses corresponds to one of said clock pulses of said plurality of clock pulses and each of said first pulse first edges of said first pulses are generated by a corresponding clock pulse first edge of said corresponding one of said plurality of clock pulses, said first pulse width being less than fifty percent of said clock pulse width;

generating a second pulse signal, said second pulse signal comprising a plurality of second pulses, each of said second pulses of said plurality of second pulses comprising a second pulse first edge and a second pulse second edge and a second pulse width between said second pulse first edge and said second pulse second edge, said second pulse signal being generated by a second local pulse generator, said second pulse signal being derived from said clock signal such that each of said second pulses of said plurality of second pulses corresponds to one of said clock pulses of said plurality of clock pulses and each of said second pulse first edges of said second pulses are generated by a corresponding clock pulse second edge of said corresponding one of said plurality of clock pulses, said second pulse width being less than fifty percent of said clock pulse width;

operatively coupling a first transparent pulse latch, to said first pulse signal;

operatively coupling a second transparent pulse latch to said second pulse signal;

ensuring that for each clock pulse of said plurality of clock pulses of said clock signal there is a first pulse of said plurality of first pulses of said first pulse signal generated by a first edge of said clock pulse and a corresponding second pulse of said plurality of second pulses of said second pulse signal generated by a second edge of said clock pulse; wherein, there is a frequency dependent separation window between a second edge of said first pulse and first edge of said corresponding second such that race conditions are avoided.

* * * * *